United States Patent
Hyun et al.

(10) Patent No.: US 6,930,062 B2
(45) Date of Patent: Aug. 16, 2005

(54) METHODS OF FORMING AN OXIDE LAYER IN A TRANSISTOR HAVING A RECESSED GATE

(75) Inventors: Sang-Jin Hyun, Gyeonggi-do (KR);
Yu-Gyun Shin, Gyeonggi-do (KR);
Bon-Young Koo, Gyeonggi-do (KR);
Sug-Hun Hong, Gyeonggi-do (KR);
Taek-Soo Jeon, Gyeonggi-do (KR);
Jeong-do Ryu, Gyeonggi-do (KR)

(73) Assignee: Samsung Electronics Co., Inc., Kyungki-Do (KR)

(*) Notice: Subject to any disclaimer, the term of this patent is extended or adjusted under 35 U.S.C. 154(b) by 0 days.

(21) Appl. No.: 10/850,690

(22) Filed: May 21, 2004

(65) Prior Publication Data

US 2005/0003679 A1 Jan. 6, 2005

(30) Foreign Application Priority Data

Jun. 4, 2003 (KR) .................... 10-2003-0036088

(51) Int. Cl.$^7$ .............................................. H01L 21/26
(52) U.S. Cl. .................. 438/790; 438/785; 438/786; 438/787; 438/765; 438/769; 438/771; 438/770
(58) Field of Search ................. 438/790, 785, 438/786, 787, 765, 769, 771, 770

(56) References Cited

U.S. PATENT DOCUMENTS 5,383,993 A * 1/1995 Katada et al. ............ 156/153
6,287,988 B1 * 9/2001 Nagamine et al. .......... 438/770
6,500,735 B2   12/2002 Usuda ......................... 438/479
6,551,947 B1    4/2003 Ono et al. ................... 438/770
6,798,038 B2 * 9/2004 Sato et al. ................... 257/510
2003/0011019 A1 * 1/2003 Inoue ........................... 257/314
2003/0040196 A1 * 2/2003 Lim et al. .................... 438/785
2003/0124793 A1 * 7/2003 Tsuji ............................ 438/241
2004/0104426 A1 * 6/2004 Forbes et al. ............... 257/325
2004/0145015 A1 * 7/2004 Mo et al. ..................... 257/341

FOREIGN PATENT DOCUMENTS

KR    2002 0081902    10/2002

OTHER PUBLICATIONS

Notice to File Response, Korean Application No. 10–2004–0036088, mailed Dec. 15, 2004.

Notice to File Response, Korean Application No. 10–2004–0036088, mailed Dec. 15, 2004.

* cited by examiner

Primary Examiner—Bradley Baumeister
Assistant Examiner—Victor V Yevsikov
(74) Attorney, Agent, or Firm—Myers Bigel Sibley & Sajovec

(57) ABSTRACT

A method of forming an oxide layer on a semiconductor substrate includes thermally oxidizing a surface of the substrate to form an oxide layer on the substrate, and then exposing the oxide layer to an ambient including predominantly oxygen radicals to thereby thicken the oxide layer. Related methods of fabricating a recessed gate transistor are also discussed.

9 Claims, 9 Drawing Sheets

US 6,930,062 B2

METHODS OF FORMING AN OXIDE LAYER IN A TRANSISTOR HAVING A RECESSED GATE

CROSS REFERENCE TO RELATED APPLICATION

This application claims priority under 35 U.S.C. § 119 to Korean Patent Application No. 2003-36088, filed Jun. 4, 2003, the contents of which are incorporated herein in its entirety by reference.

BACKGROUND OF THE INVENTION

1. Field of the Invention

The present invention relates to semiconductor devices, and, more particularly, to transistors having recessed gates and methods of forming the same.

2. Description of the Related Art

Many methods of forming oxide layers have been introduced in recent years. Typical examples of such methods may include thermal oxidation and radical oxidation. Thermal oxidation, which involves heating a substrate while exposing it to an oxygen ambient, has been conventionally employed as a typical method. In radical oxidation, the substrate is exposed to an ambient predominantly made up of oxygen radicals (O*).

When thermal oxidation is applied, the growth rate and thickness of the oxide layer may be greatly influenced by crystal orientation in the substrate. In particular, the growth rate of the oxide layer may be faster in directions having a high area density <110> than in directions having a low area density <100>. In addition, defects may occur in the interface between the oxide layer and the substrate in directions having high a area density. For example, weak bonds and dangling bonds may be formed in the interface between the oxide layer and the substrate in directions that have a high area density. The weak bonds and the dangling bonds may be caused by incompletely oxidized silicon, such as $Si_2O$ and $Si_2O_2$.

FIGS. 1 and 2 are cross-sectional views illustrating methods of forming oxide layers using thermal oxidation.

FIG. 1 illustrates how growing conditions of the oxide layer can be influenced by crystal orientation in the substrate. Referring to FIG. 1, the substrate 10 having a <100> crystal direction is etched to form a trench 12. The bottom of the trench 12 has a <100> direction, and the sidewalls of the trench 12 have <110> directions.

Referring to FIG. 2, a thermal oxidation process is applied to the substrate 10 to form a thermal oxide layer 14 on a surface of the substrate 10 including the inner walls of the trench 12. As shown in FIG. 2, due to differences in growing rates due to crystal orientation, the thickness (A) of the oxide layer at the bottom of the trench having a <100> direction is thinner than the thickness (B) of the oxide layer on the sidewalls of the trench having <110> directions. In addition, due to stress incurred during the oxide layer formation, the growth of the oxide layer is suppressed at the edges 16 of the trench 12, forming a thinner oxide layer.

As previously mentioned, there may be several problems associated with an oxide layer formed on the sidewalls of a trench 12 having <110> crystal directions. Furthermore, when a strong electric field is applied to the edge of the trench 12, breakdown voltage may be decreased and leakage current may more easily occur at the edge of the trench 12. In addition, in a transistor having a recessed gate (which includes a gate pattern formed in the trench 12 and the thermal oxide layer 14 as a gate oxide layer), devices may operate inadequately if the thermal oxide layer 14 is of low quality.

SUMMARY OF THE INVENTION

According to embodiments of the present invention, a method of forming an oxide layer on a semiconductor substrate may include thermally oxidizing a surface of the substrate to form an oxide layer on the substrate, and then exposing the oxide layer to an ambient predominantly made up of oxygen radicals to thereby thicken the oxide layer.

In some embodiments, the step of exposing the oxide layer to an ambient can include exposing the oxide layer to an ambient comprising an oxidation gas, and sufficiently dissociating the oxidation gas so that the ambient includes predominantly oxygen radicals. The step of dissociating the oxidation gas may further include exposing the oxidation gas to microwave irradiation and/or laser excitation. In addition, the step of thermally oxidizing the substrate can include heating the substrate in a furnace or using a rapid thermal oxidation (RTO).

According to further embodiments of the present invention, a method of fabricating a recessed gate transistor may include forming a trench on a surface of a semiconductor substrate, thermally oxidizing the surface of the substrate to form an oxide layer in the trench, and then exposing the oxide layer to an ambient predominantly made up of oxygen radicals to thereby thicken the oxide layer. In some embodiments, the oxygen radicals may thicken the oxide layer at edges of the trench.

In further embodiments, the step of exposing the oxide layer to an ambient can include exposing the oxide layer to an ambient comprising an oxidation gas, and sufficiently dissociating the oxidation gas so that the ambient includes predominantly oxygen radicals. The step of dissociating the oxidation gas may further include exposing the oxidation gas to microwave irradiation and/or laser excitation. In addition, the step of thermally oxidizing the substrate can include heating the substrate in a furnace or using a rapid thermal oxidation (RTO).

DETAILED DESCRIPTION OF THE INVENTION

Figure 1:
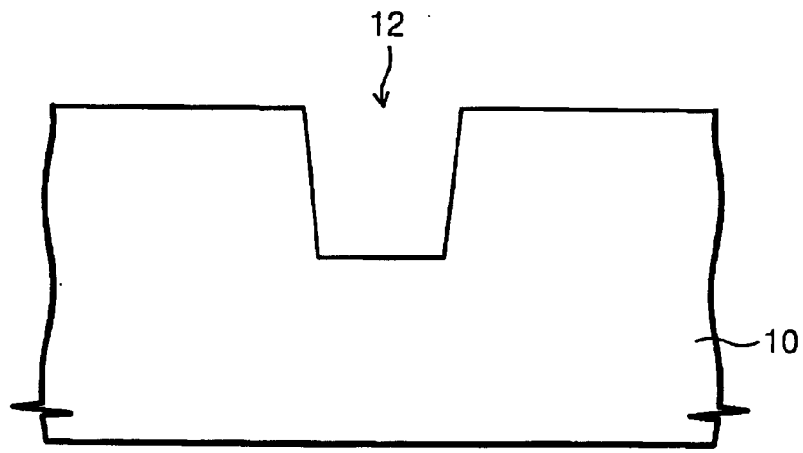
FIGS. 1 and 2 are cross-sectional views illustrating conventional problems in forming an oxide layer using a thermal oxidation process.
Figure 2:
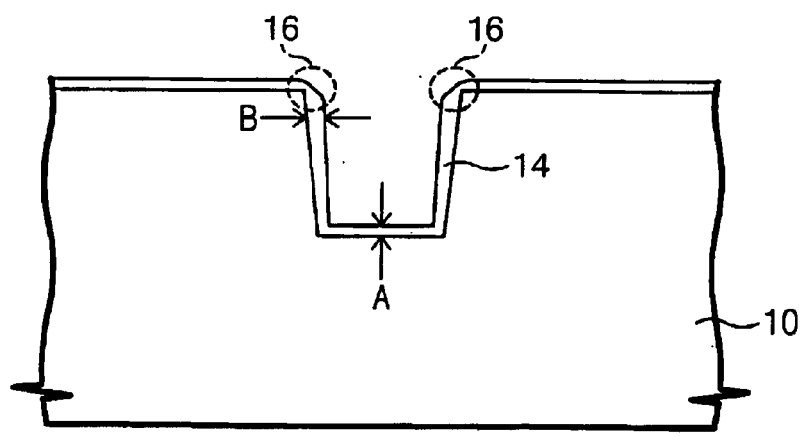

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "under" another element, it can be directly under the other element or intervening elements may also be present. It will also be understood that the term "and/or" as used herein refers to and encompasses any and all possible combinations of one or more of the associated listed items.

Furthermore, relative terms such as beneath may be used herein to describe one layer or regions relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "beneath" is intended to encompass both above and beneath in this situation. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

Figure 3:
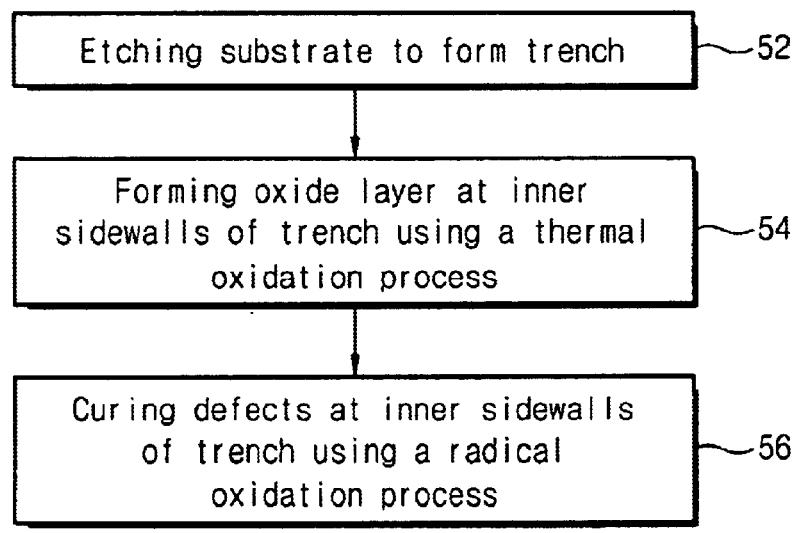
FIG. 3 is a flow chart illustrating methods of forming an oxide layer according to embodiments of the present invention.

FIG. 3 is a flow chart showing methods of forming an oxide layer according to embodiments of the present invention.

Figure 4:
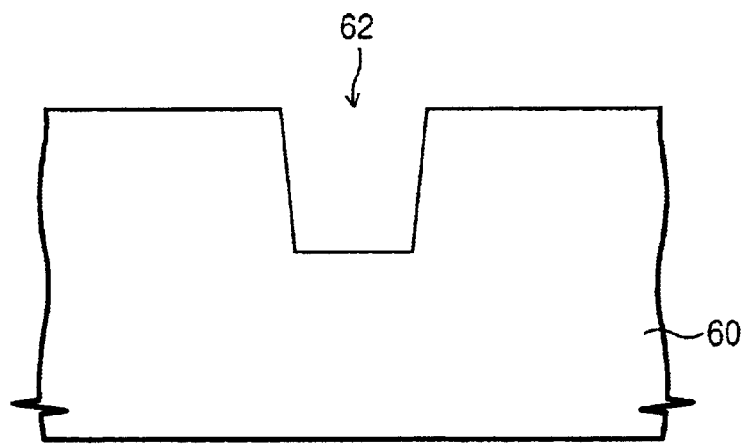
FIG. 4 through FIG. 6 are cross-sectional views illustrating methods of forming an oxide layer according to embodiments of the present invention.
Figure 5:
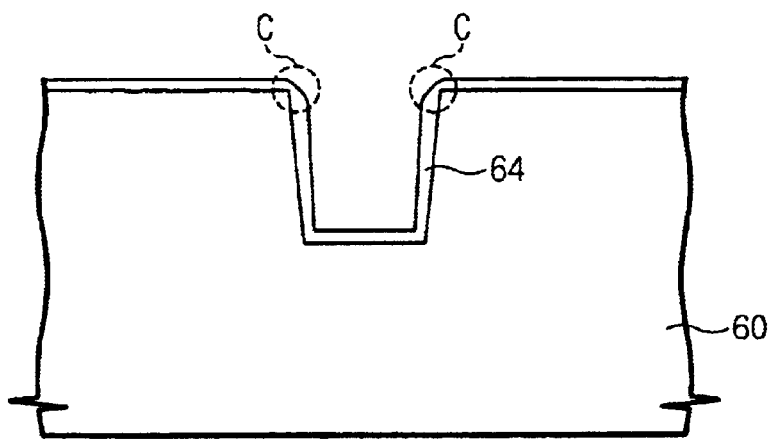
Figure 6:
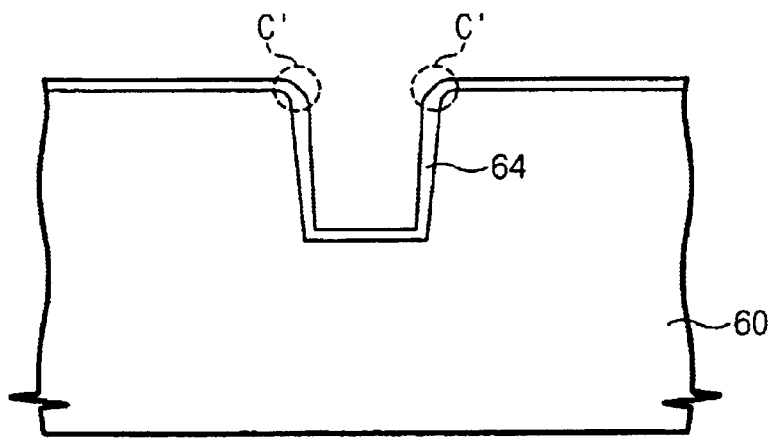

FIG. 4 through FIG. 6 are cross-sectional views showing methods of forming an oxide layer according to embodiments of the present invention.

Referring to FIG. 3 and FIG. 4, a substrate 60 is etched to form a trench 62 at Block 52 of FIG. 3. The substrate 60 has a <100> crystal direction. The bottom of the trench 62 also has a <100> crystal direction, and the sidewalls of the trench 62 have <110> crystal directions or nearly <110> crystal directions.

Referring to FIG. 3, and FIG. 5, a thermal oxide layer 64 is formed on the sidewalls of the trench 62 using a thermal oxidation process at Block 54 of FIG. 3. The thermal oxidation process may be performed by exposing the substrate 60 to an oxygen atmosphere in a heating furnace, or by making use of rapid thermal oxidation (RTO). The thermal oxide layer 64 is formed relatively thicker on the sidewalls of the trench 62, which have <110> crystal directions, than at the bottom of the trench 62, which has a <100> crystal direction. In addition, the thermal oxide layer 64 is formed thinner at the edges (C) of the trench 62 than at any other portion. Further, defects are formed in the sidewalls of the trench 62 having <110> crystal directions, due to the oxide layer's growing characteristics.

Referring to FIG. 3 and FIG. 6, the sidewalls of the trench 62 are cured by employing a radical oxidation process at Block 56 of FIG. 3. The radical oxidation process provides a high quality oxide layer which may be formed at a low temperature by exposing the substrate to an ambient that is predominantly made up of atomic oxygen with a high reaction rate, i.e. oxygen radicals (O*). The oxygen radicals may be generated by dissociating an oxidation gas using, for example, microwave irradiation, laser excitation, or in-situ steam generation. There is also a low thermal budget in radical oxidation, as the oxide layer is formed at a low temperature. Additionally, the growth rate of the oxide layer is not affected by crystal orientation, since growth of the oxide layer is greatly influenced by the reaction of the radical oxygen.

By bonding the oxygen radicals with the incompletely oxidized silicon at the interface of the thermal oxide layer 64 and the substrate 60, interface defects may be removed.

Figure 7:
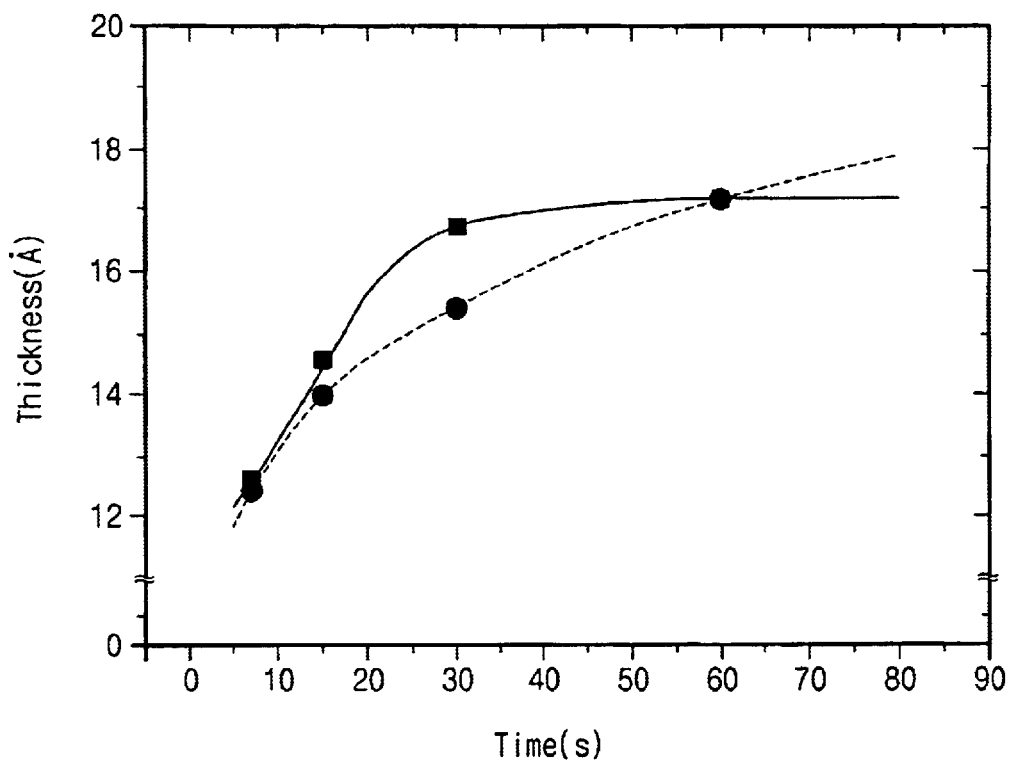
FIG. 7 is a graph illustrating the thickness of the oxide layer over time when employing a thermal oxidation process as compared to a radical oxidation process.

FIG. 7 is a graph illustrating the thickness of the oxide layer over time when employing a thermal oxidation process as compared to a radical oxidation process. In the graph, the radical oxidation process follows a solid curve, and the thermal oxidation process follows a dotted curve.

As shown in graph, the oxide layer is formed relatively thick at first in radical oxidation, due to the high reaction rate of the radical oxygen. But, with the passage of about thirty seconds, the growing rate is dramatically decreased. On the other hand, if thermal oxidation is applied, the thickness of the oxide layer steadily increases with the passage of time.

Accordingly, during the curing of the sidewalls of the substrate 60, the thickness of the oxide layer 64 increases relatively little on the inner sidewalls of the trench 62. However, the oxide layer thickness is further increased at the edges (C) of the trench 62. As a result, as shown in FIG. 6, the shape of the oxide layer 64 at the edge (C') of the trench 62 is round.

The trench 62, which now has rounded edges and sidewalls with reduced defects, may be very valuable in fabricating recessed gate transistors. The gate pattern of a recessed gate transistor may be formed in the trench 62.

Figure 8:
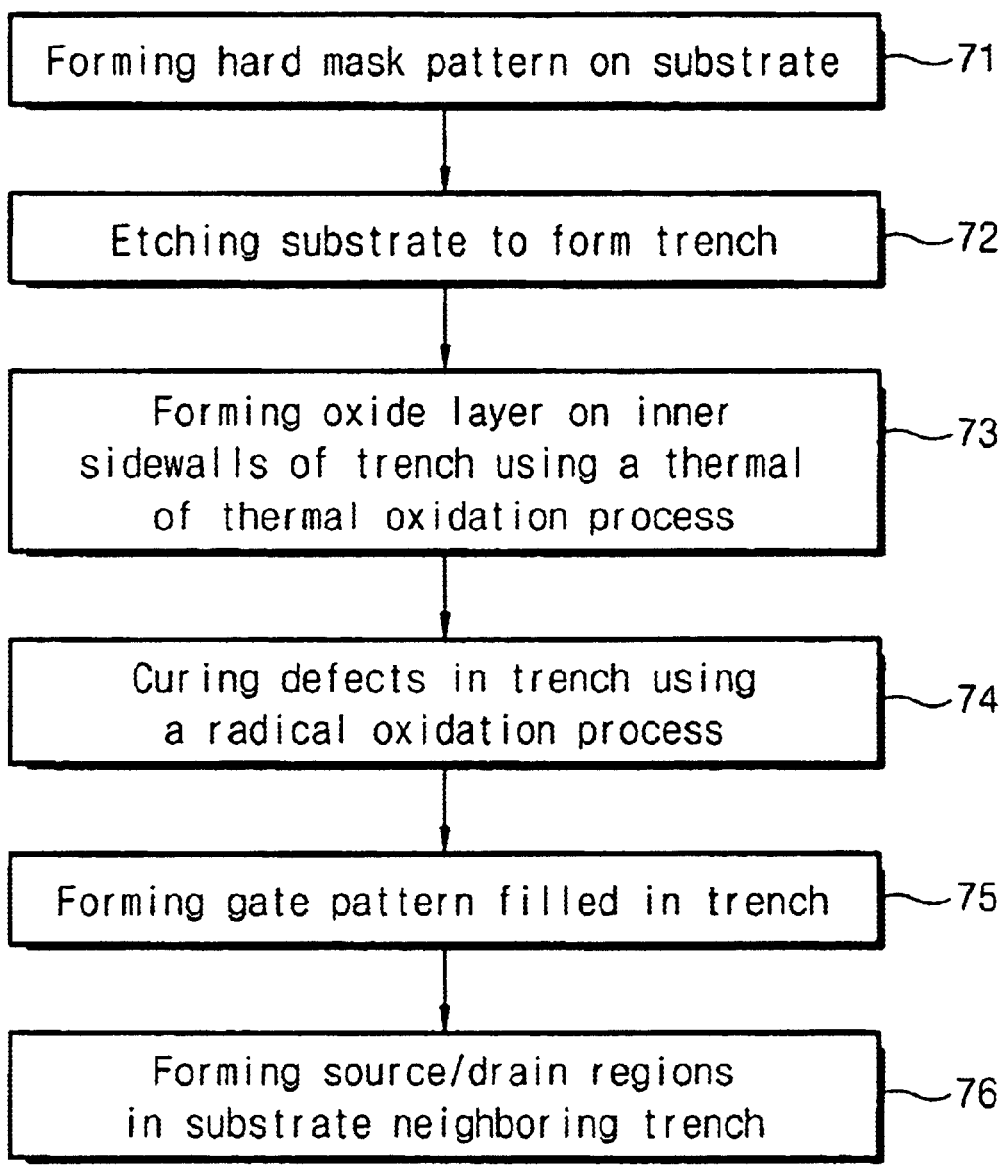
FIG. 8 is a flow chart illustrating methods of fabricating a transistor having a recessed gate according to further embodiments of the present invention.

FIG. 8 is a flow chart illustrating methods for fabricating recessed gate transistors according to further embodiments of the present invention.

FIG. 9 through FIG. 14 are cross-sectional views illustrating methods of fabricating recessed gate transistors according to further embodiments of the present invention.

Figure 9:
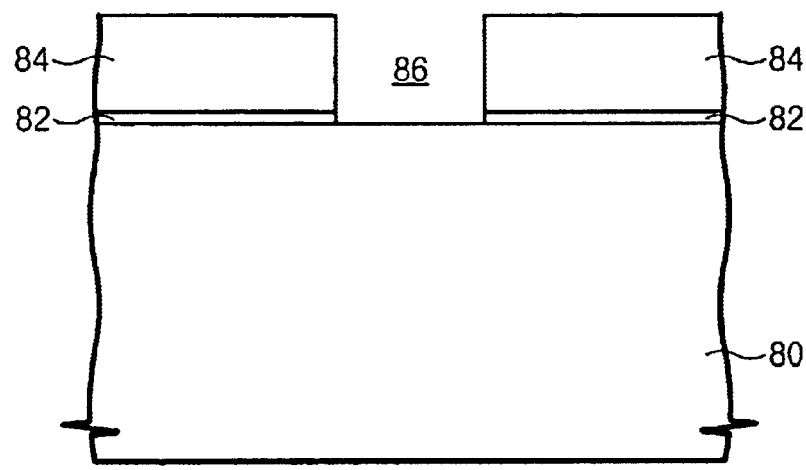
FIG. 9 through FIG. 14 are cross-sectional views illustrating methods of fabricating a transistor having a recessed gate according to further embodiments of the present invention.

Referring to FIG. 8 and FIG. 9, a hard mask pattern 84 is formed on a substrate 80 at Block 71 of FIG. 8. The hard mask pattern 84 may be formed of a material having an etch selectivity with respect to the substrate 80, such as silicon nitride. Since the hard mask pattern 84 can stress the substrate, a buffer oxide layer 82 is formed on the substrate 80 before forming the hard mask pattern 84. The hard mask pattern 84 includes an opening 86 which exposes a portion of the substrate 80. A trench region is defined by the opening 86.

Figure 10:
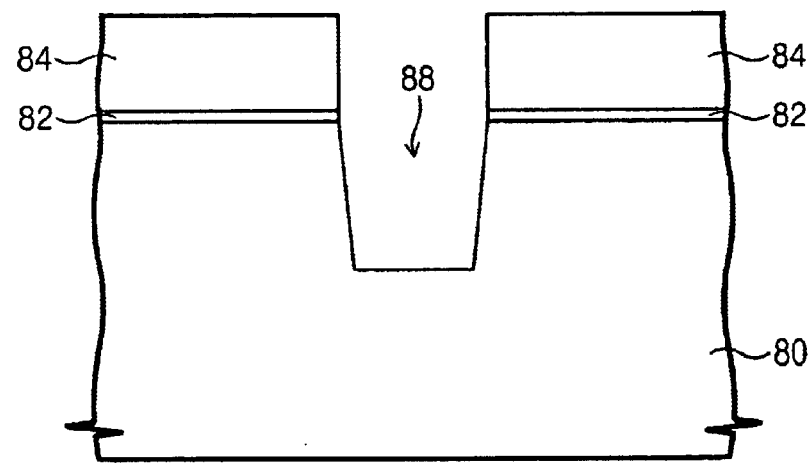

Referring to FIG. 8 and FIG. 10, the portion of the substrate 80 that is exposed at the opening 86 is etched using the hard mask pattern 84 as an etch mask at Block 72 of FIG. 8. As a result, a trench 88 corresponding to the opening 86 is formed on the substrate 80. The substrate 80 has a <100> crystal direction, so the bottom of the trench 88 also has a <100> crystal direction. The sidewalls of the trench 88 have <110> crystal directions or nearly <110> crystal directions.

Figure 11:
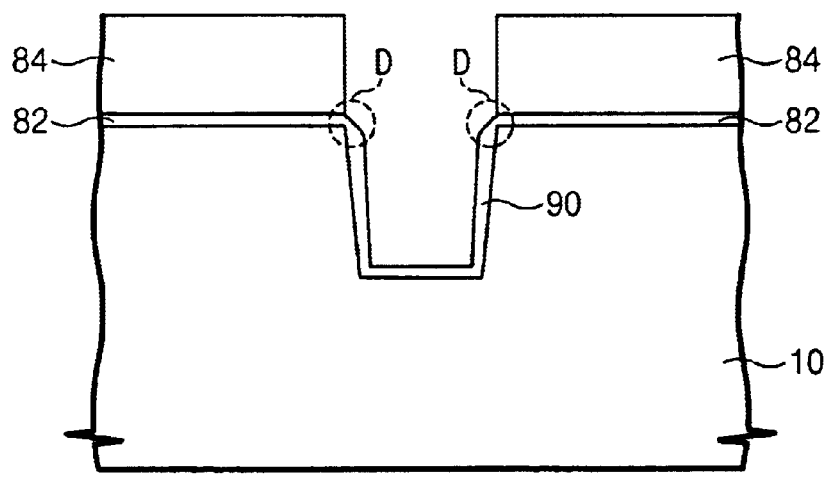

Referring to FIG. 8 and FIG. 11, a thermal oxide layer 90 is formed on the inner sidewalls of the trench 88 using thermal oxidation at Block 73 of FIG. 8. The thermal oxide layer 90 is equivalent to a gate oxide layer in a transistor. The thermal oxide layer 90 is formed relatively thicker on the sidewalls of the trench 88 due to the high area density. However, at the bottom of the trench 88, the thermal oxide layer 90 is formed thinner. In addition, at the edges (D) of the trench, the thermal oxide layer 90 is formed even thinner than at the bottom.

Although not shown, a channel region may be formed by implanting impurities into the substrate 80 neighboring the trench 88. Preferably, the channel region is formed relatively thin. Accordingly, to prevent impurities from diffusing during thermal oxidation, impurities may be implanted after forming the thermal oxide layer 90.

Figure 12:
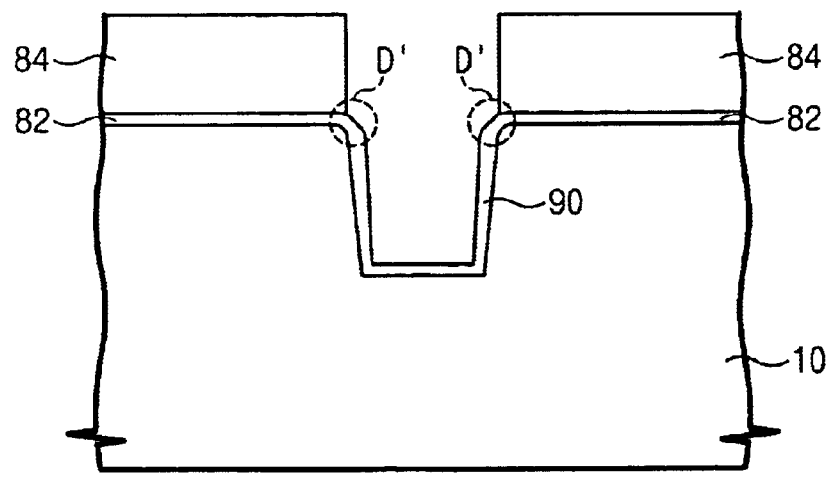

Referring to FIG. 8 and FIG. 12, defects at the inner sidewalls of the trench 88 are cured by employing a radical oxidation process at Block 74 of FIG. 8. Specifically, interface defects such as dangling bonds and oxide vacancies can be cured. During radical oxidation, the thickness of the oxide layer 90 is also further increased at the edges (D) of the trench 88. As a result, the edges (D') of the trench 88 are rounded. Furthermore, lattice defects, which may occur when impurities are implanted to form the channel region, can also be cured.

Consequently, the oxide layer 90 is formed thicker on the sidewalls of the trench 88 than at the bottom of the trench 88. Also, defects caused by oxide layer growth and impurity implantation are cured in the radical oxidation process.

Figure 13:
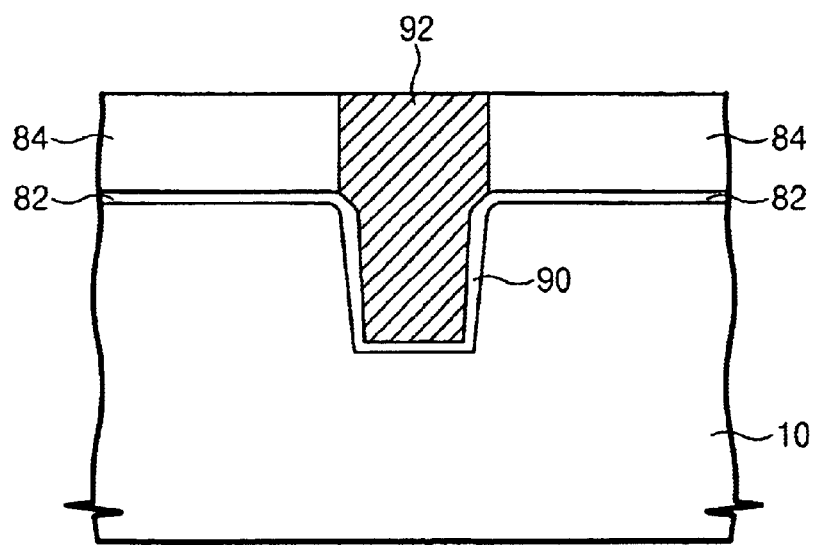

Referring to FIG. 8 and FIG. 13, a conductive layer is formed on the surface of the substrate 80 at Block 75 of FIG. 8. The conductive layer is then polished using chemical-mechanical polishing (CMP) to form a gate pattern 92 in the trench 88. The conductive layer may be formed of polysilicon, tungsten, tungsten silicide and/or stacked layers of polysilicon and metal. Also, an adhesion layer may be further formed on the oxide layer 90, which now serves as a gate oxide layer for the gate pattern 92.

Figure 14:
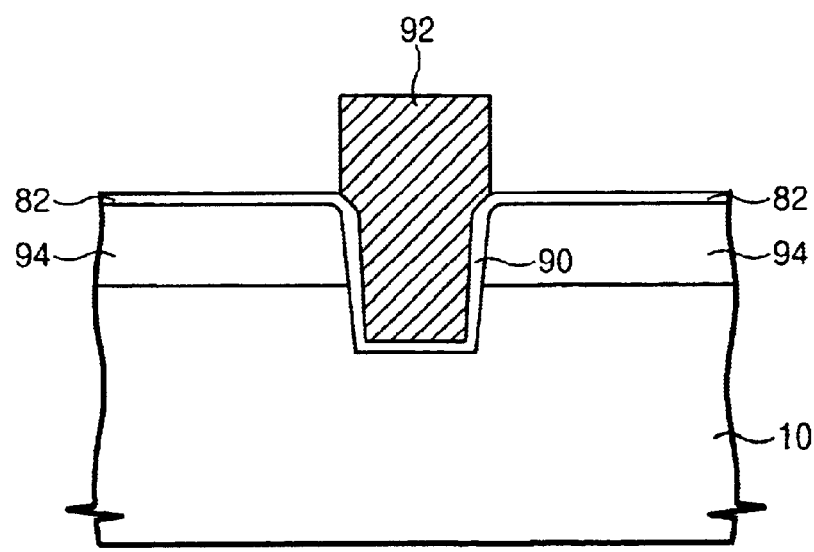

Referring to FIG. 8 and FIG. 14, the hard mask pattern 84 is removed, and impurities are implanted into the substrate 80 neighboring both sides of the gate pattern 92 to form source/drain regions 94 at Block 76 of FIG. 8. The source/drain regions 94 may have a predetermined junction depth. The substrate 80 is adjacent to the trench 88 under the source/drain regions 94. Additionally, the substrate is equivalent to a channel region of a transistor. Therefore, while the portion of the gate oxide layer 90 which is adjacent to the channel region is relatively thin, the thickness of the portion of the oxide layer 90 between the source/drain regions 94 and the gate pattern 92 is relatively thick. Consequently, parasitic capacitance is decreased, and operation speed for the transistor can be dramatically improved. In addition, the portion of the oxide layer 90 at the edge of the trench 88 is rounded, due to the radical oxidation process used after forming the thermal oxide layer. As a result, the concentration of the electric field at the edge of the trench 88 can be reduced.

Figure 15:
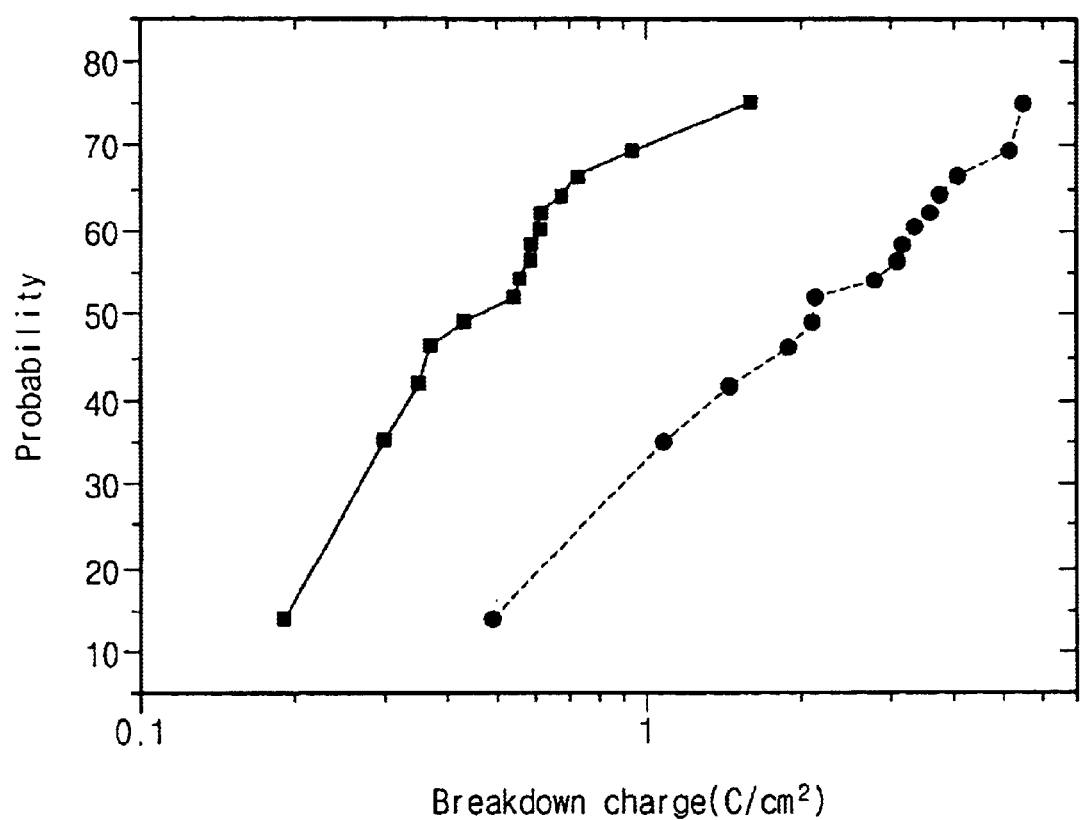
FIG. 15 is a graph illustrating breakdown charge characteristics of the oxide layer formed according to embodiments of the present invention, as compared with an oxide layer formed by a thermal oxidation process.

FIG. 15 is a graph showing breakdown charge characteristics of the oxide layer formed using radical oxidation according to embodiments of the present invention as compared to an oxide layer formed by thermal oxidation. In the graph, the abscissa represents breakdown charge, and the ordinate represents probability. The breakdown charge of the oxide layer formed by thermal oxidation follows a solid curve (in this case, the thickness and dimensions of the oxide layer is 40 Angstrom and 120000 $\mu m^2$, respectively). The oxide layer formed by radical oxidation follows a dotted curve.

As shown in the graph, the breakdown charge is still higher for thermal oxidation followed by radical oxidation than for thermal oxidation only. Also, interface defects between the thermal oxide layer and the substrate are cured through the radical oxidation process. This indicates that quality of the oxide layer is improved.

As previously mentioned, according to embodiments of the present invention, after forming an oxide layer using thermal oxidation, interface defects between the oxide layer and the substrate can be cured by employing radical oxidation. As a result, leakage current through the oxide layer can be suppressed, and breakdown voltage can be increased.

In addition, when the gate oxide layer of a recessed gate transistor is formed using thermal oxidation followed by radical oxidation, the oxide layer is formed thicker on the sidewalls of the trench but thinner at the bottom of the trench. Therefore, parasitic capacitance is reduced between the gate pattern and the source/drain regions. In addition, the turn-on speed of the transistor can be increased. Furthermore, by performing radical oxidation, interface defects between the substrate and the gate oxide layer are cured, and the concentration of the electric field is reduced at the edges of the trench. As a result, performance of the transistor can be improved.

In the drawings and specification, there have been disclosed embodiments according to the invention and, although, specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of fabricating a recessed gate transistor, comprising:

forming a trench in a surface of a semiconductor substrate;

thermally oxidizing the trench to define an oxide layer on a bottom, sidewalls, and upper edges of the trench;

selectively thickening portions of the oxide layer on the upper edges of the trench relative to other portions of the oxide layer on the sidewalls and bottom of the trench by exposing the oxide layer to an ambient comprising predominantly oxygen radicals;

forming a gate conductive layer in the trench to define a recessed gate pattern; and implanting impurities into the substrate on opposite sides of the recessed gate pattern adjacent the portions of the oxide layer on the upper edges of the trench to define source/drain regions.

2. The method of claim 1, wherein exposing the oxide layer to an ambient comprises:

exposing the oxide layer to an ambient comprising an oxidation gas; and sufficiently dissociating the oxidation gas so that the ambient comprises predominantly oxygen radicals.

3. The method of claim 2, wherein the step of dissociating the oxidation gas comprises exposing the oxidation gas to microwave irradiation and/or laser excitation.

4. The method of claim 1, wherein the step of thermally oxidizing the trench comprises heating the substrate in a furnace or using a rapid thermal oxidation (RTO) process.

5. A method of fabricating a recessed gate transistor comprising the steps of:

etching a semiconductor substrate to form a trench;

forming a gate oxide layer on inner sidewalls, upper edges, and a bottom surface of the trench by making use of a thermal oxidation process;

selectively thickening portions of the oxide layer on the upper edges of the trench relative to other portions of the oxide layer on the sidewalls and bottom of the trench by exposing the substrate including the gate oxide layer to radical oxygen (O*) to cure defects at an interface of the gate oxide layer and the substrate;

filling a conductive layer in the trench to form a gate pattern; and implanting impurities in the substrate neighboring both sides of the gate pattern to form source/drain regions.

6. The method of fabricating the transistor of claim 5, wherein the gate oxide layer is formed by heating the substrate in heat furnace or applying a rapid thermal oxidation process.

7. The method of fabricating the transistor of claim 5, wherein the radical oxygen is formed by making use of an in-situ steam generation (ISSG).

8. The method of fabricating the transistor of claim 5, wherein the radical oxygen is formed by exciting gases containing oxygen through microwave.

9. The method of fabricating the transistor of claim 5, before forming the gate pattern, further comprising implanting impurities in the substrate neighboring the trench to form a channel layer.

* * * * *